United States Patent
Kim et al.

(10) Patent No.: US 9,994,969 B2
(45) Date of Patent: Jun. 12, 2018

(54) VIEW PORT FOR OBSERVING INGOT GROWTH PROCESS AND INGOT GROWTH APPARATUS INCLUDING SAME

(71) Applicant: LG SILTRON INC., Gyeongsangbuk-do (KR)

(72) Inventors: Seong-Hyeok Kim, Gyeongsangbuk-do (KR); Gwang-Ha Na, Gyeongsangbuk-do (KR); Hyun-Su Jang, Gyeongsangbuk-do (KR)

(73) Assignee: SK Siltron Co., Ltd., Gyeongsangbuk (KR)

(*) Notice: Subject to any disclaimer, the term of this patent is extended or adjusted under 35 U.S.C. 154(b) by 33 days.

(21) Appl. No.: 15/104,966

(22) PCT Filed: Aug. 1, 2014

(86) PCT No.: PCT/KR2014/007115
§ 371 (c)(1),
(2) Date: Jun. 15, 2016

(87) PCT Pub. No.: WO2015/093706
PCT Pub. Date: Jun. 25, 2015

(65) Prior Publication Data
US 2016/0319458 A1    Nov. 3, 2016

(30) Foreign Application Priority Data

Dec. 19, 2013  (KR) .......................... 10-2013-0158918

(51) Int. Cl.
*C30B 15/20* (2006.01)
*C30B 15/00* (2006.01)
(Continued)

(52) U.S. Cl.
CPC .............. *C30B 15/00* (2013.01); *C30B 15/20* (2013.01); *C30B 15/26* (2013.01); *C30B 15/30* (2013.01); *C30B 29/06* (2013.01)

(58) Field of Classification Search
CPC ................................ C30B 15/02; C30B 15/20
See application file for complete search history.

(56) References Cited

U.S. PATENT DOCUMENTS 3,639,718 A * 2/1972 Castonguay ............ C30B 15/26
                                                           117/202
4,014,656 A * 3/1977 Leibenzeder ........... C30B 15/26
                                                           117/203
(Continued)

FOREIGN PATENT DOCUMENTS

CN        1031404 A      3/1989
CN        1267751 A      9/2000
(Continued)

OTHER PUBLICATIONS

International Search Report for corresponding PCT Application PCT/KR2014/007115 dated Nov. 27, 2014 (4 pages).
(Continued)

*Primary Examiner* — Robert M Kunemund
(74) *Attorney, Agent, or Firm* — Lewis Roca Rothgerber Christie LLP (57) ABSTRACT

A view port for observing ingot growth process of the present embodiment is as a view port for observing the inside of a chamber providing a space in which a growth process of an ingot is performed includes a body part disposed on the a side of the chamber and having a hole connected to the inside of the chamber; a window being inserted into the hole of the body part to maintain a sealing state of the chamber and through which light being transmitted from the inside of the chamber; and, a window purge being disposed on the side of the body part an forms air curtain.

(Continued)

The view port of the present invention proposed has an advantage of prevention of the glass contamination as well as self-cleaning of the contaminated glass of the view port. The ingot that grows in the inside of the chamber may be clearly observed through such a view port and then the process condition is determined through the process data accurately observed. Therefore, there is an advantage that is capable of producing the high quality of the ingot.

14 Claims, 6 Drawing Sheets

(51) Int. Cl.
*C30B 29/06* (2006.01)
*C30B 15/26* (2006.01)
*C30B 15/30* (2006.01)

(56) References Cited

U.S. PATENT DOCUMENTS

| | | | |
|---|---|---|---|
| 4,650,540 A | 3/1987 | Stoll | |
| 6,203,610 B1* | 3/2001 | Altekruger | C30B 15/26 117/14 |
| 8,968,468 B2* | 3/2015 | Hamada | C30B 15/26 117/13 |

FOREIGN PATENT DOCUMENTS

| | | |
|---|---|---|
| CN | 102677147 A | 9/2012 |
| CN | 103147121 A | 6/2013 |
| JP | 63270390 A | 11/1988 |
| JP | 09-110581 A | 4/1997 |
| JP | 10-029894 A | 2/1998 |
| JP | 11-097359 A | 4/1999 |
| JP | 2000226293 A | 8/2000 |
| JP | 2003-332318 | 11/2003 |
| JP | 2004-217469 | 8/2004 |
| JP | 3557756 B2 | 8/2004 |
| KR | 2000-226293 A | 8/2000 |
| KR | 100777335 B1 | 11/2001 |

OTHER PUBLICATIONS

JP Office action dated Apr. 28, 2017 issued in corresponding JP Application No. 2016-538621, 3 pages.
CN Office action issued in corresponding CN 201480070054.3, dated Dec. 5, 2017, 3 pages.
EP Extended Search issued in corresponding application No. EP14872807.4 dated Oct. 13, 2017, 3 pages.

* cited by examiner

VIEW PORT FOR OBSERVING INGOT GROWTH PROCESS AND INGOT GROWTH APPARATUS INCLUDING SAME

CROSS REFERENCE TO RELATED APPLICATION(S)

The present application is a National Phase application and claims priority to and the benefit of International Application PCT/KR2014/007115, with an international filing date of Aug. 1, 2014, which claims the priority benefit of Korean Application No. 10-2013-0158918, filed Dec. 19, 2013, each of the contents of which are incorporated herein by reference in their entirety for all purposes.

BACKGROUND

The present invention relates to a view port for observing ingot growing and an ingot growth apparatus including the view point.

A silicon single crystal ingot which is generally material of a wafer is prepared using a Czochralski method (CZ method).

The CZ method is an ingot growing method that causes an ingot to be grown to have an predetermined diameter by putting silicon into a quartz crucible, heating the quartz crucible causing the silicon to be melted, and then rotating and gradually pulling up seed crystal in a state of contacting the seed crystal with silicon melt to solidify the silicon melt into solid on the seed single crystal surface.

Such an ingot growth apparatus is provided in the inside of a chamber. The chamber provides a space in which predetermined processes are performed for growing the ingot for a wafer which is used in material of an electronic component such as a semiconductor.

In addition, a separate view port is installed on a side of the chamber for observing the ingot which grows in the inside of the chamber, since the chamber is sealed to prevent contaminant from entering the inside of the chamber and to maintain internal atmosphere.

It is possible to be observed growing of the ingot by the naked eyes through such a view port as well as to be measured process data such as a diameter of the growing ingot and a melt gap by a diameter measurement sensor, a melt gap (M/G) measurement sensor, or the like.

Hereinafter, accurate measuring of the process data in the inside of the chamber is an important factor in determining the quality of ingot, since a process condition such as ingot pulling speed, heater power, or the like is determined in consideration of the real-time process data measured as above.

But, the problem that a glass of the view point is contaminated is occurred by gas or vaporized dopant generated in the quartz crucible in the inside of the chamber.

Particularly, it is difficult to observe the inside of the chamber as well as an error in the process data, such as measured diameter through the view port is generated, since the vaporized dopant causes the lower surface of the glass to be contaminated and to be opaque.

In order to prevent such an error, a method for adjusting movement speed of a sensor, sensitivity of sensor, or the like is proposed, but the reduction effect of the error is insufficient.

Therefore, the problem that the quality of the grown ingot is degraded occurs, since the process condition is determined by such an inaccurate process data.

SUMMARY

The present invention is to solve the problems described above, and to provide a view port for being capable of being accurately observed the growing of the ingot by preventing the window from being contaminated, and an ingot growth apparatus including the view port.

A view port for observing ingot growth process of the present embodiment is as a view port for observing the inside of a chamber providing a space in which a growth process of an ingot is performed, the view port includes a body part disposed on the a side of the chamber and having a hole connected to the inside of the chamber, a window being inserted into the hole of the body part to maintain a sealing state of the chamber and through which light is transmitted from the inside of the chamber, and, a window purge being disposed on the side of the body part and forms air curtain in order to prevent outer air from approaching the window.

An ingot growth apparatus of the present embodiment includes a chamber being provided a space in which an ingot growth process is performed and being sealed, a quartz crucible being disposed on the inside of the chamber and receiving silicon melt, a pulling means causing the ingot to be grown by dipping in the silicon melt, rotating and pulling a seed, and a view port being installed on the side of the chamber and transmitting light from the inside of the chamber to be capable of observing process condition of the inside of the chamber, in which the view point includes a body part disposed on a side of the chamber and having a hole connected to the inside of the chamber, a window being inserted into the hole of the body part to maintain a sealing state of the chamber and through which light is transmitted from the inside of the chamber, and a window purge being disposed on the side of the body part and forming air curtain in order to prevent outer gas from approaching the window.

The view port of the present embodiment proposed has an advantage of preventing the glass from being contaminated as well as self-cleaning the contaminated glass of the view port.

The ingot that grows in the inside of the chamber may be clearly observed through this view port.

In addition, through the view port, process data in the inside of the chamber such as the diameter of the ingot which is grown may be accurately measured.

Accordingly, the present embodiment has an advantage of being capable of producing high quality of ingot by determining the ingot growth process condition by means of the process data accurately measured.

DETAILED DESCRIPTION OF THE EMBODIMENTS

Hereinafter, the present embodiment will be described with reference to drawings attached. However, the range of spirit of the invention which the present embodiment has from contents disclosed by the present embodiment can be defined, and the spirit of the invention which the present embodiment has includes implementation modifications such as addition, deletion, or change of the component with respect to proposed embodiment.

Figure 1:
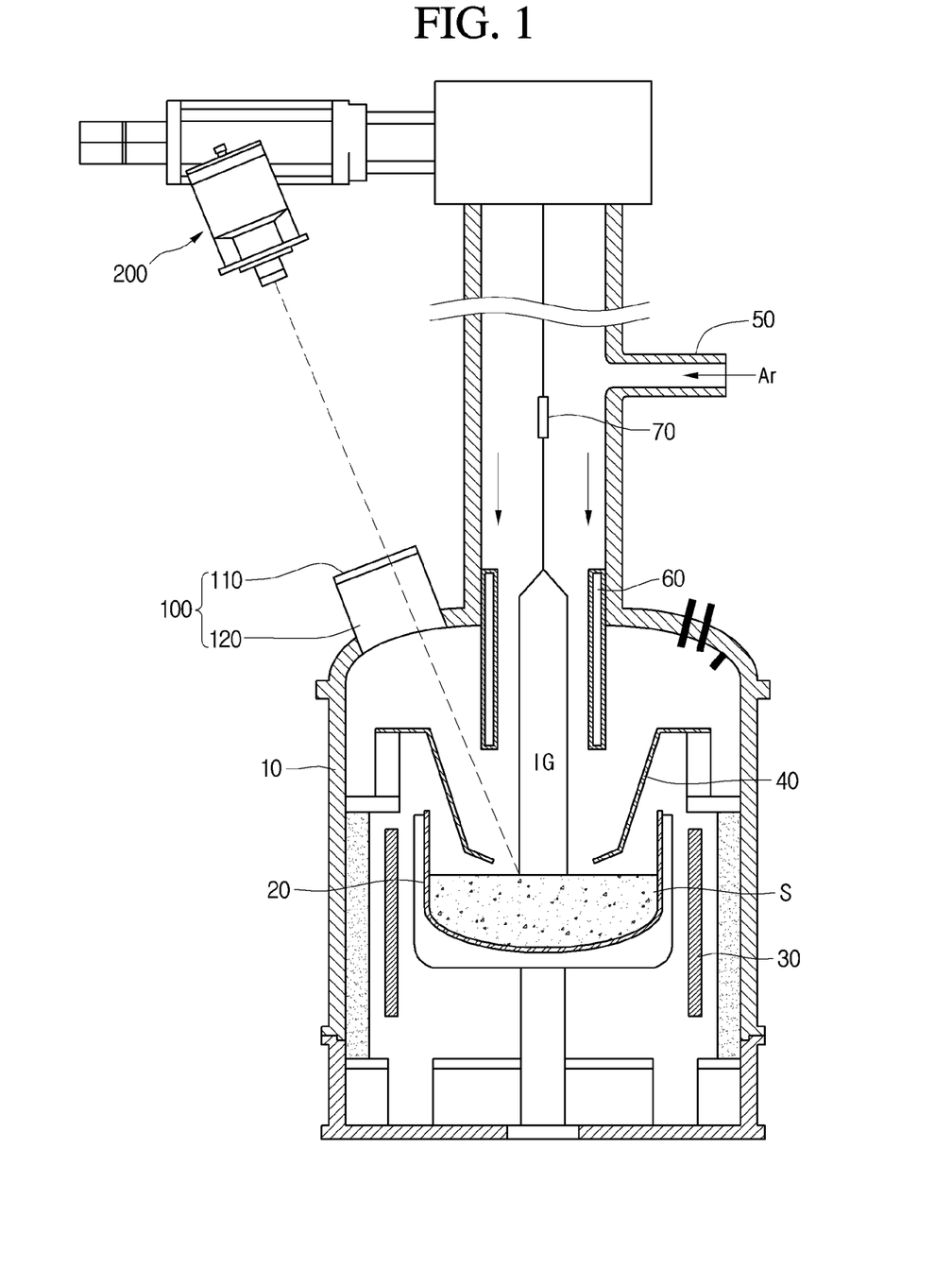
FIG. 1 is a view illustrating schematic appearance of an ingot growth apparatus.

FIG. 1 is a view illustrating schematic appearance of an ingot growth apparatus.

The general components of the ingot growth apparatus are disposed in the inside of the chamber 10 and the chamber 10 is sealed, a view port 100 has to be provided for observing the ingot (IG) that grows in the inside of the chamber 10.

The view port 100 is installed on a side of the chamber 10 for observing the process state in the inside of the chamber 10 and a window is provided to transmit light and to maintain the sealing state of the chamber 10 in the view port.

It is possible to be observed the ingot growth process by the naked eyes through this window 110 and sensors are provided on the outside of the chamber 10 and thus the process state such as the diameter of the ingot is measured through the window 110 and the measured process state is output as process data.

Since the process condition such as pulling speed is determined based on the process data, the accurate measurement of the process data has a great influence on the quality of the ingot.

Particularly, since whether or not the diameter of ingot is uniform in the process state is a critical factor in determining the quality of the ingot, the ingot having a uniform diameter is produced only in a case where the diameter of the ingot is accurately measured through the view port 100.

The factor which is determined as the process state of the inside of the chamber 10 includes, in addition to the diameter of the ingot, a melt gap (M/G) which is a height difference between a heat shield 40 and a silicon melt (S), or the like. However, hereinafter, for convenience of description, the process state will be described as the diameter of ingot which is grown.

Meanwhile, the window 110 of the view point 100 may be contaminated and become opaque during the proceeding of the ingot growth process.

Particularly, since the vaporized antimony is absorbed on the window 110 during the process which causes the ingot to be grown in the silicon melt in which the antimony (Sb) dopant is contained, there is a case where the window 110 is foggily contaminated to a degree that the inside of the chamber 10 cannot be observed at all. In this case, the measured diameter data of the ingot through the foggily contaminated window 10 has an error which is different from an actual diameter of the ingot.

Figure 2:
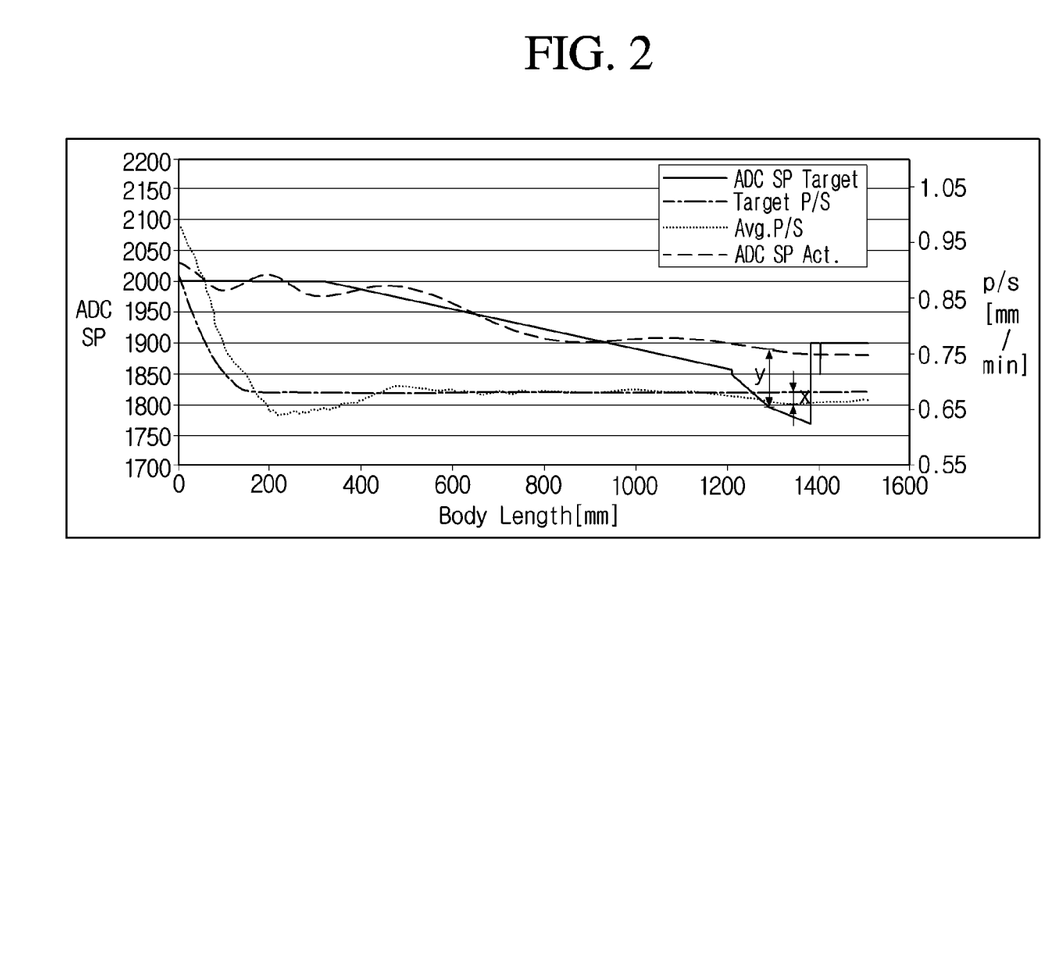
FIG. 2 is a graph illustrating difference between a target diameter measured value and a diameter measured value of the general ingot growth apparatus, and a graph illustrating difference between a target pulling speed and an average pulling speed of the general ingot growth apparatus.

FIG. 2 is a graph illustrating difference between a target diameter measured value and a diameter measured value of the general ingot growth apparatus, and a graph illustrating difference between a target pulling speed and an average pulling speed of the typical ingot growth apparatus.

As a sensor 200 that measures the diameter of the ingot and outputs the measured diameter of the ingot as process data, various sensors such as an infrared Sensor (IR sensor), a CCD camera, or a pyrometer may be used. As a control part that controls the diameter of the ingot by analyzing the output process data and changing pulling speed (P/S), an Automatic Diameter Control (ADC) sensor may be used.

In the present embodiment, as diameter measuring data, the ADC value is used and as a sensor which measures the ADC value and a control part which controls the diameter using the ADC value an ADC sensor unit 200 is described but it is natural that the present invention is not limited to this.

With reference to FIG. 2, in the initial of the body growth process of the ingot, the difference between target ADC value (ADC SP Target) and ADC value (ADC SP Act.) is low and also there is little difference between an average pulling speed (Avg. P/S) controlled according to the ADC value and target pulling speed (Target P/S).

Here, "target" means aim value which is designed before process in advance and on which the process proceeds based. In other words, the pulling speed is controlled by comparing between the ADC value sensed during the process and target ADC value, and the ingot of which distance is uniform and of which quality is high is produced when the controlled pulling speed approaches the target pulling speed.

But, it can be seen that the difference (y) between the target ADC value and the measured ADC value is rapidly increased as the body growth process proceeds to the latter portion and according to this, the difference (x) between the target pulling speed and the average pulling speed is also increased.

In a case where the ingot is produced in this way, the diameter of the ingot is changed as the body growth process proceeds to the latter portion and according to this, problem is generated that the quality of the ingot is reduced.

In order to solve the problem described above, the view point 100 installed in the ingot growth apparatus of the present embodiment is configured to allow itself to prevent and remove contamination of the window.

A First Embodiment

Figure 3:
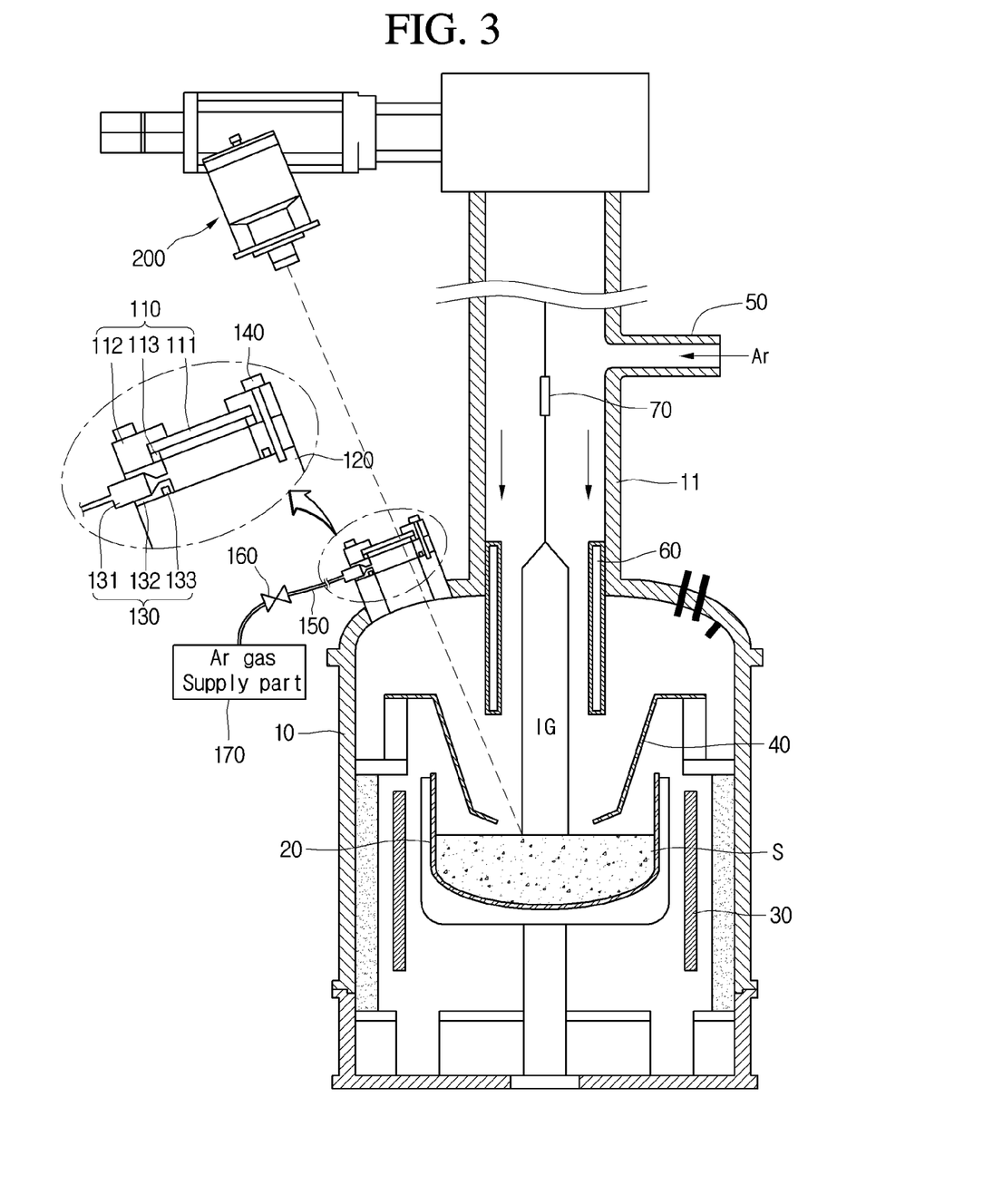
FIG. 3 is a view schematically illustrating a cross-section of the ingot growth apparatus on which a window purge is mounted according to a first embodiment of the present invention.

FIG. 3 is a view schematically illustrating a cross-section of the ingot growth apparatus on which a window purge is mounted according to an embodiment of the present invention.

With reference to FIG. 3, the ingot growth apparatus according to the present embodiment includes a chamber 10, a quartz crucible 20 that contains silicon melt, a heater 30 for heating the quartz crucible 20, a seed chuck 70 for fixing a seed that contacts the ingot in the silicon melt and pulls the ingot, a pulling means that raises, lowers, and rotates the seed chuck 70, a heat shield 40 that forms a melt gap (M/G) between the heat shield body and the silicon melt in the upper side of the quartz crucible 20, and an inert gas injection unit 50 that supplies inert gas to the inside of the chamber 10 to control the flow of inert gas and atmosphere.

The ingot growth apparatus according to the present embodiment includes a view port 100 for observing the inside of the chamber 10 and further includes a ADC sensor unit 200 that measures the diameter of the ingot through the view port 100 from outside of the chamber 10 and controls the diameter of the ingot by control of the pulling speed using the measured data.

Particularly, the view port 100 includes a body part 120 that is disposed in the chamber 10 and has a hole for being capable of observing the inside of the chamber 10, a window 110 that is disposed on the top part of the body part 120 and through which light is transmitted to allow to observe the inside of the chamber 10, and a window purge 130 that injects gas in order to prevent the window 110 from being contaminated.

More specifically, the body part 120 may be composed of a tube that is mounted on the upper side of the chamber 10 and that has a hole which allows the process state in the inside of the chamber to be observed. For example, the body part may be composed of a cylindrical tube that extends from upper part of the chamber 10 to the upper side in order to face a meniscus of the growing ingot and of which the inner diameter is about 45 cm.

A window hole is provided in the upper side of the body 120. A window 110 is provided in the window hole and a glass 111 of transparent material through which light is capable of being transmitted is inserted in the window 10.

The glass 111 may be made of glass as well as various materials through which light is capable of being transmitted. In addition, the glass is preferably made of quartz glass that has a heat resistant property and does not allow the ingot to be contaminated.

A window purge 130 is interposed between the body part 120 and the window 110 and the window purge injects inert gas in order to prevent contaminant from approaching the window 110.

A gas injection unit 131 may be included in the window purge 130 and injects the inert gas toward lower side of the glass 111. Therefore, an air curtain may be formed which prevent contaminant from being entered the glass 111 and the cause glass to be heat-insulated to outside air.

The gas injection unit 131 may be placed anywhere on the one side of the window purge 130. For example, as illustrated in FIG. 3, the gas injection unit 131 may be disposed on the window purge 130 in the direction opposite to the upper part of the chamber 10, but it is not limited to this.

In addition, the gas injection unit 131 may be disposed on the window purge 130 of the upper side of the chamber 10 unlike that shown.

In other words, the gas injection unit 131 may be disposed on the optimal position for injecting inert gas to the glass 111 according to the shape of the chamber 10 and the shape of the view port 100.

Further, the gas injection unit 131 may remove contaminant absorbed to the glass 111 by adjusting angle of the nozzle and injecting gas toward the glass 111.

Meanwhile, as described above, the view port 100 is separated into the window 110, the body part 120, and the window purge 130 and each is separately described. However, it is possible for the view point to be configured integrally.

For example, it is possible to be formed to have structure in which the glass is inserted into a hole in the inside of the cylindrical tube extended from the upper part of the chamber 10 and the gas injection unit is mounted on the side surface of the cylindrical tube to inject gas toward the glass.

But, in this embodiment, the window purge 130 and the window 110 may be composed of a flange for maintaining the sealing state of the chamber 10.

For example, the window purge 130 may be disposed so that the purge body 132 having a hole is disposed on the upper part of the body part 120 with a purge O-ring 133 interposed therebetween and the window 110 may be disposed so that window body 112 having hole is arranged on the upper part of the purge body 132 with a window O-ring 113 interposed therebetween. At this time, the hole of the view port 100 may be completely sealed by gasket and O-ring further being disposed around the glass 111 interposed in the hole of the window body 112.

A plurality of a screw grooves are provided on the window 110, the body part 120 and the window purge 130 respectively. The window 110, the body part 120 and the window purge 130 are securely coupled with each other, by bolts 140 being tightened in the screw grooves.

In other words, in the present embodiment, the window purge 130 is coupled with the upper side of the body part 120 by a flange and the window 110 is coupled with the upper side of the window purge 130 by a flange in order to maintain the sealing state of the chamber 10. However, the present embodiment is not limited to this.

Meanwhile, in order to supply gas to the gas injection unit 131, the gas supply part 170 is connected to gas the injection part 131 through a gas line 150 and thus inert gas is supplied to the gas injection unit 131.

At this time, a gas valve 160 and a gas flow meter is installed in the gas line 150 in order to adjust the supply pressure of the gas and to check the injected gas flow rate, and thus appropriate gas supply pressure and total gas flow rate may be controlled.

For example, the gas which is injected from the window purge 130 is inert gas and Ar gas may be used as inert gas. The supply pressure of the Argon gas is defined between about 2.5 kg/cm$^2$ to about 2.8 kg/cm$^2$. The total injected gas flow rate is preferably 20 lpm or less.

The gas supply part 170 may be configured separately in order to supply gas to only the window purge 130 as well as the gas line 150 may be configured by branching off from a line which supplies inert gas to the existing inert gas injection unit 50.

According to the first embodiment of the invention described above, there are advantages that the process state in the inside of the chamber may be accurately observed and measured and the process condition may be controlled using the accurately measured data and thus the high quality of the ingot may be produced, by preventing the contamination of the glass and removing the absorbed contaminant.

Meanwhile, the view port 100 is obliquely extended in order to face the meniscus as described above. At this time, the side surface of the view port 100 facing the upper chamber 11 in which ingot is grown is referred to the upper part of the view port 100 and the side surface of the view port 100 facing the lower chamber 10 which is opposite to the upper part of the view port 100 is referred to the lower part of the view port 100.

It is preferable to inject gas from the upper part of the view port 100 to the lower part thereof in order to form effective air curtain to the view port 100 which is tilted as described above.

In addition, the inert gas in the inside of the chamber 10 flows from the upper chamber 11 in which the ingot grows to the lower chamber 10 and thus it is preferable that the gas injection unit 131 injects gas from the upper part of the view port 100 to the lower port thereof in order not to interfere with such a flow of the gas.

In other words, the gas injection unit 131 is installed between the upper chamber 11 and view port 100 (the upper port of the view port 100), and thus it is effectively prevented contaminant from approaching glass 111 when gas is injected toward the lower part of the view port 100.

At this time, it may be difficult for gas injection unit 131 and the gas line 150 to be configured, since the space between the upper chamber 11 and the view port 100 is narrow.

A Second Embodiment

The structure of the second embodiment of the present invention is same as that of the first embodiment except for the structure of the window purge 130, and accordingly description about common parts between the second embodiment and the first embodiment described above will be omitted herein.

The view port 100 of the second embodiment of the present invention has the gas injection unit 131 on the lower part of the view port 100, however, it is possible to form an effective air curtain, since the window purge 130 injects gas at the upper part of the view port 100 facing the installed portion of the gas injection unit 131.

Figure 4:
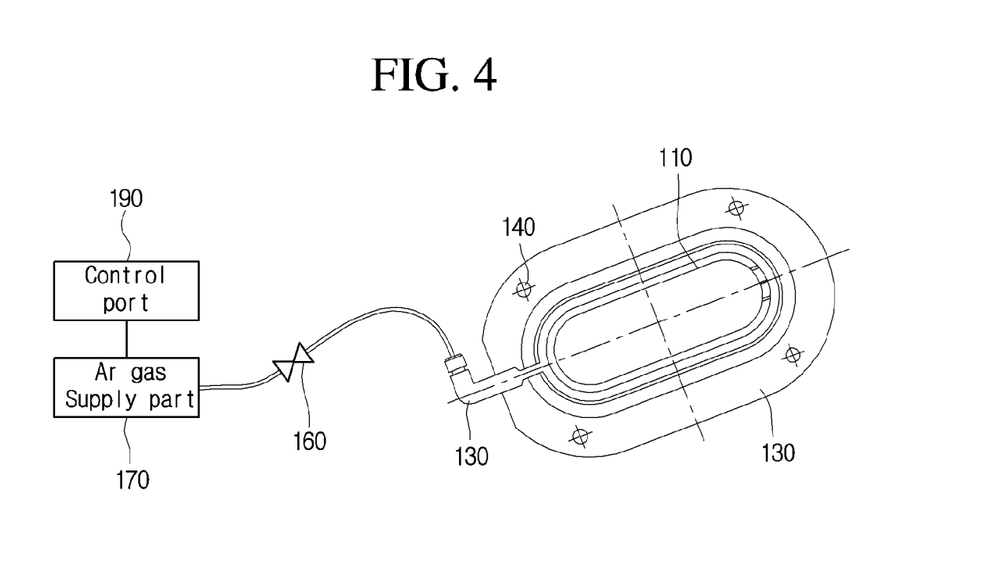
FIG. 4 is a plan view illustrating a view port that forms an effective air curtain according to a second embodiment of the present invention.
Figure 5:
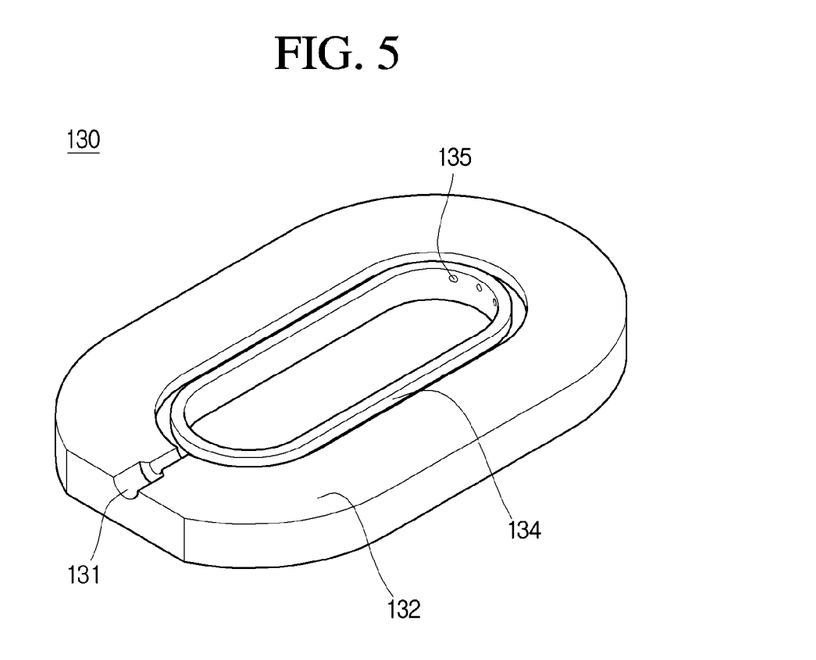
FIG. 5 is a cross-sectional perspective view illustrating a window purge viewed from the upper side according to the second embodiment of the present invention.
Figure 6:
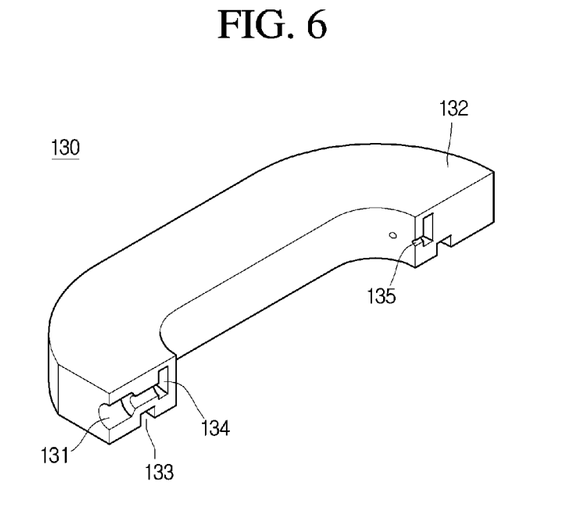
FIG. 6 is a cross-sectional perspective view illustrating a window purge viewed from the side according to the second embodiment of the present invention.
Figure 7:
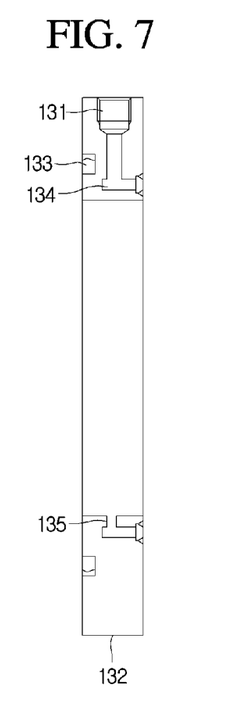
FIG. 7 is a side view illustrating a window purge according to the second embodiment of the present invention.

FIG. 4 is a plan view illustrating a view port that forms an effective air curtain according to a second embodiment of the present invention, FIG. 5 is a cross-sectional perspective view illustrating a window purge viewed from the upper side according to the second embodiment of the present invention, FIG. 6 is a cross-sectional perspective view illustrating a window purge viewed from the side according to the second embodiment of the present invention, and FIG. 7 is a side view illustrating a window purge.

With reference to FIG. 4 to FIG. 7, the window purge 130 is formed with flange, a gas guide part 134 through which the supplied gas is moved is provided in the inside of the purge body 132 formed by flange and the gas vent port 135 which injects the moved gas is provided between the gas guide part 134 and the purge body 132.

Through the gas vent port 135, when the gas injection unit 131 supplies gas from one side of the purge body 132 to the inside thereof, the supplied gas is moved along the gas guide part 134 to the gas vent port 135 and the moved gas from the gas vent port 135 is vented, thereby air curtain is formed.

In other words, the gas vent port 135 is formed at the position to be injected the gas from the purge body 132, and when the gas injection unit 131 and the gas vent port 135 is connected to each other through the gas guide part 134, the gas injection unit 131 is capable of injecting gas to the desired position regardless of the supply position of gas.

In the present embodiment, the gas injection unit 131 is mounted on the purge body 132 facing the under part of the view port 100, the gas vent port 135 is provided on the purge body 132 facing the upper part of the view port 100, and the gas injection unit 131 and the gas vent port 135 is connected to each other through the gas guide part 134 formed along the purge body 132.

Through these configurations, the gas which is injected from the lower part of the view port 100 is moved along the gas guide part 134 and may be injected from the upper part of the view port 100.

At this time, a plurality of the gas vent port 135 is configured to widen the area of the air curtain, and the gas vent port is configured to have a shape of hole which is extended in the transverse direction unlike that shown.

According to the structure of the second embodiment described above, since the window purge is capable of effectively forming the air curtain, there are advantages that contamination of the glass is prevented and the flow of the gas in the inside of the chamber is not interfered.

Meanwhile, the gas supply part 170 may be connected to a control part 190.

The control part 190 may be control the gas supply pressure which is injected from the gas supply part 170 according to process.

For example, the gas supply pressure may be increased at the ingot growth process period such as melting process period, dopant input process period, or the like in which contaminants are intensively generated.

A Third Embodiment

Figure 8:
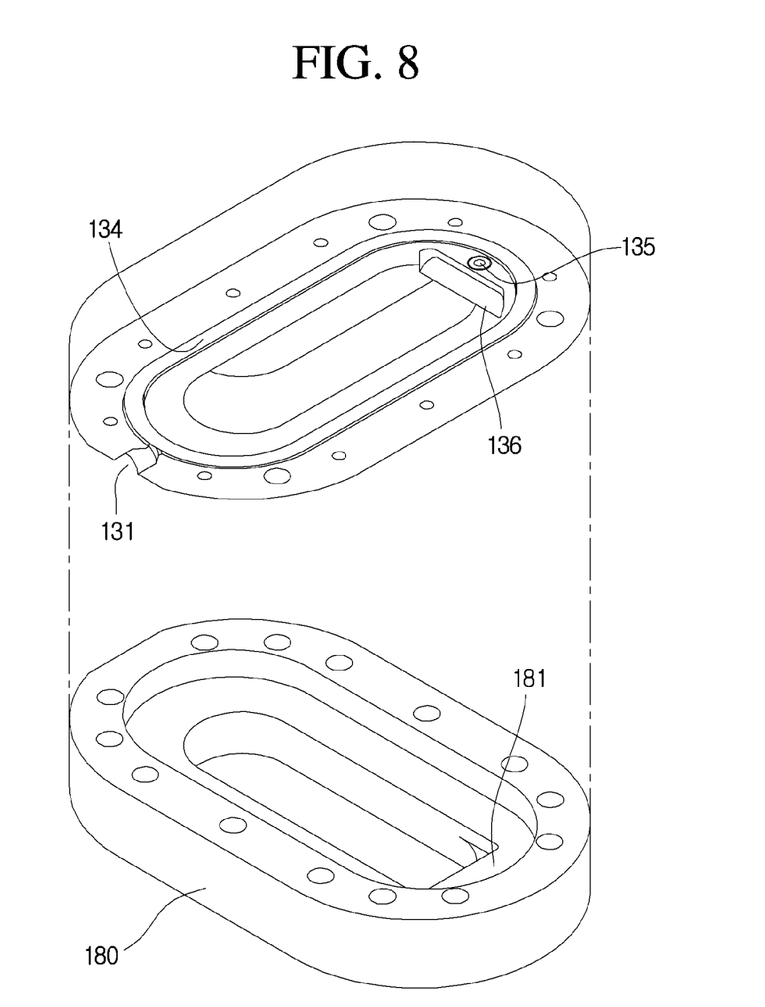
FIG. 8 is an exploded perspective view illustrating a window purge according to a third embodiment of the present invention.

FIG. 8 is an exploded perspective view illustrating a window purge according to a third embodiment of the present invention.

The structure of the third embodiment of the present invention is same as that of the first embodiment except for the structure of the window purge 130, and accordingly description of common parts between the third embodiment and the first and second embodiments described above will be omitted herein.

In the third embodiment of the present invention, a sloping jaw 136 is disposed between the gas vent port 135 and the lower surface of the glass 111 and thus the gas which is vented from the gas vent port 135 is branched off by penetrating the sloping jaw 136. Therefore, by the third embodiment, the air curtain which is uniform and dense is formed on the lower side horizontal surface of the glass 111.

More specifically, the window purge of the third embodiment of the present invention includes the first window purge 130 that injects gas, and the second window purge 180 coupled with the lower surface thereof.

The first window purge 130 includes the gas injection unit 131 that supplies gas, the gas guide part 134 that guides the supplied gas, the gas vent port 135 that injects the guided gas in the vertical direction, and the sloping jaw 136 that is branched off the vented gas.

The window purge 180 is coupled to the lower surface of the first window purge 130 with a predetermined space being spaced apart from the sloping jaw and thus the vented gas is injected the lower side of the glass 111 through the predetermined space.

In other words, the gas that is vented in a vertical direction from the gas vent port 135 is blocked by the body 181 of the second window purge 180 and thus is injected after being branched off into the predetermined space between the sloping jaw 136 and the body 181. Therefore, the air curtain that is dense and uniform may be formed.

According to the structure of this third embodiment, since the dense and uniform air curtain is formed on the lower side of the glass 111, the bottom surface of the glass 111 is effectively prevented from being contaminated.

The present invention relates to an ingot growth apparatus for production of the wafer and a view port used therein. Therefore, the present invention has industrial Applicability.

What is claimed is:

1. A view port for observing the inside of a chamber providing a space in which a growth process of an ingot is performed, comprising:
a body part disposed on a side of the chamber and having a first hole connected to the inside of the chamber;
a window being inserted into the first hole of the body part to maintain a sealing state of the chamber and through which light is being transmitted from the inside of the chamber; and
a window purge for injecting gas towards the window, wherein the window purge comprises:
a purge body disposed between the body part and the window and having a second hole connected with the first hole;
a gas guide part forming a closed loop inside the purge body;
a gas injection unit inserted into the purge body and connected to a first portion of the gas guide part; and
a plurality of gas vent ports connected to a second portion of the gas guide part.

2. The view port of claim 1, wherein the window purge is coupled to an upper side of the body part using a flange.

3. The view port of claim 2, wherein the window is coupled to the upper side of the window purge using a flange.

4. The view port of claim 1, wherein the gas injection unit includes a gas nozzle being capable of controlling a direction of gas injection.

5. The view port of claim 1, wherein the gas guide part has a passage for moving gas supplied from the gas injection unit, and the gas vent ports inject the moved gas toward the window.

6. The view port of claim 1, wherein the gas vent ports have an elongated shape in a transverse direction to inject gas to a large area.

7. The view port of claim 1, further comprising a sloping jaw for branching off the injected gas in the window purge.

8. An ingot growth apparatus, comprising:
a chamber being provided a space in which an ingot growth process is performed and sealed;
a quartz crucible being disposed on the inside of the chamber and receiving silicon melt;
a pulling means causing the ingot to be grown by dipping in the silicon melt, rotating and pulling a seed; and
a view port being installed on a side of the chamber and transmitting light of inside of the chamber to observe process condition of the inside of the chamber,
wherein the view port includes a body part disposed on a side of the chamber and having a first hole connected to the inside of the chamber, a window being inserted into the first hole of the body part to maintain a sealing state of the chamber and through which light is being transmitted from the inside of the chamber; and a window purge for injecting gas towards the window,
wherein the window purge comprises:
a purge body disposed between the body part and the window and having a second hole connected with the first hole;
a gas guide part forming a closed loop inside the purge body;
a gas injection unit inserted into the purge body and connected to a first portion of the gas guide part; and
a plurality of gas vent ports connected to a second portion of the gas guide part.

9. The ingot growth apparatus of claim 8, further comprising a sensor part measuring a state of the ingot growth process through the view port.

10. The ingot growth apparatus of claim 9, wherein the sensor part is a diameter measurement sensor measuring a diameter of the ingot being grown from the silicon melt.

11. The ingot growth apparatus of claim 8, further comprising a gas supplying part for supplying gas to the window purge, and a gas line connecting the gas supplying part and the window purge.

12. The ingot growth apparatus of claim 8, wherein antimony is contained as a dopant in the silicon melt.

13. The ingot growth apparatus of claim 11, further comprising a control part being connected to the gas supplying part and controlling a gas injection pressure depending on the ingot growth process.

14. A view port for observing the inside of a chamber providing a space in which a growth process of an ingot is performed, comprising:
a body part disposed on a side of the chamber and having a first hole connected to the inside of the chamber, a window maintaining a sealing state of the chamber and being capable of observing the inside of the chamber; and a window purge for injecting gas toward the window to prevent the window from being contaminated,
wherein the window purge comprises:
a purge body disposed between the body part and the window and having a second hole connected with the first hole;
a gas guide part forming a closed loop inside the purge body;
a gas injection unit inserted into the purge body and connected to a first portion of the gas guide part; and
a plurality of gas vent ports connected to a second portion of the gas guide part.

* * * * *